United States Patent [19]

Brüggemann

[11] Patent Number: 5,031,046
[45] Date of Patent: Jul. 9, 1991

[54] REMOTE CONTROL DEVICE FOR A TELEVISION SET

[75] Inventor: Ulrich Brüggemann, Heustreu, Fed. Rep. of Germany

[73] Assignee: Preh-Werke GmbH & Co. KG, Bad Neustadt A.D. Saale, Fed. Rep. of Germany

[21] Appl. No.: 533,009

[22] Filed: Jun. 1, 1990

[51] Int. Cl.$^5$ .......................... H04N 5/44; H04N 5/45
[52] U.S. Cl. ............... 358/194.1; 358/191.1; 358/192.1; 358/22; 358/181; 455/617; 455/603; 455/606
[58] Field of Search .......... 358/194.1, 191.1, 192.1, 358/22, 87, 181; 455/617, 603, 606; 340/784

[56] References Cited

U.S. PATENT DOCUMENTS

| 4,746,981 | 5/1988 | Nadan et al. | 358/22 |
| 4,779,134 | 10/1988 | Mak | 358/181 |
| 4,800,376 | 6/1989 | Suga et al. | 358/87 |

FOREIGN PATENT DOCUMENTS

| 2154663 | 8/1972 | Fed. Rep. of Germany . |
| 2215329 | 10/1973 | Fed. Rep. of Germany . |
| 2542021 | 3/1977 | Fed. Rep. of Germany . |
| 2612260 | 9/1977 | Fed. Rep. of Germany . |
| 2937133 | 4/1980 | Fed. Rep. of Germany . |
| 3401678 | 7/1984 | Fed. Rep. of Germany . |
| 3310580 | 9/1984 | Fed. Rep. of Germany . |
| 3322729 | 1/1985 | Fed. Rep. of Germany . |
| 3919451 | 1/1990 | Fed. Rep. of Germany . |
| 55-140371 | 1/1980 | Japan | 358/194.1 |
| 1246972 | 2/1989 | Japan . |

OTHER PUBLICATIONS

Shuji Aruga et al., "1988 International Display Research Conference", 1988, 236–241.
Funkschau, Nov. 30, 1990.
Toshiba Brochure, excerpt, Sep. 1989.
"Im Dialog" Funkschau, 13/1984, pp. 51–52.
"Displays: Einführung indie Technik aktiver und passiver Anzeigen", Peter M. Knoll, 1986, Dr. Alfred Hüthig Verlag GmbH, Heidelberg, pp. 216–220.
Sony Programm '88/'89, p. 23.
SAA 3000, UAA 1000, IC-Satz für Bild im Bild, Bestell Nr. 6251-117-3D, Apr. 1978, p. 3–8.
ED87 Internationale Ausstellung und Konferenz, Oct. 14–16, 1987.
"Fernbedienung des Fernsehgeräts mit der TV-Maus", May 22, 1989.
GRAETZ TV-Video-HiFi 88/89.
COM SIEMENS-Magazin für Computer, Communications, 2/89, p. 43.
Funkschau, Jun. 2, 1989, "Jetzt sind Sie am Drücker?", p. 25.

Primary Examiner—James J. Groody
Assistant Examiner—Glenton B. Burgess
Attorney, Agent, or Firm—Wegner, Cantor, Mueller & Player

[57] ABSTRACT

A remote control unit radiates signals of operated program selection keys (3) via an infrared transmitter circuit (10, 11, 12). In order to simplify the selection of one of several TV programs for the user, the remote control device has a receiver circuit (18 to 23). The latter detects picture signals of the TV programs to be selected via program selection keys (3). A storage unit stores these picture signals. To each of the program selection keys (3) on the remote control set a picture display (6) is assigned. A control circuit (24, 29, 30) distributes the picture signals from the storage (25) cyclically to the picture displays (6).

6 Claims, 5 Drawing Sheets

REMOTE CONTROL DEVICE FOR A TELEVISION SET

BACKGROUND OF THE INVENTION

The invention relates to a remote control device for a TV set comprising several program selection keys and an infrared transmitter circuit which radiates signals from operated keys to the TV set.

Such remote control devices are known. On such a TV set an indicating display is often provided next to the kinescope, showing the program selection chosen by the remote control device.

There are also TV sets known wherein a picture of another program can be mixed into the picture of a current program. Such a TV set is equipped with two tuners, the first tuner receiving the video and audio signals of the main program received and the second tuner only the videosignals of another program. Both tuners are controlled by the same program storage. Such a TV set is described in the ITT brochure "IC-set for picture within a picture", No. 6521-117-3D, April 1978.

It was also proposed to divide the picture of the TV set into four, nine or sixteen areas of the same size with each of these areas; one of the programs being selected shown in the form of permanently renewing still pictures (cf. catalog of the firm SONY, program 88/89, p. 23). In this case the tuner receives the programs provided in the program storage one after the other, reduces the picture contents, digitizes this and deposits the picture gained thereby in a storage unit. After digitalization the pictures appear on the corresponding area of the screen of the TV set. For example, every 2 to 5 seconds new pictures appear from the programs. A simultaneous, uninterrupted watching of a program, i.e. watching without still pictures, is impossible.

Often liquid crystal displays are used for small screens of TV sets. In these sets there are thin-film transistors between glass panes or non-linear elements for selecting the individual picture elements. Such liquid crystal displays are described in Peter M. Knoll, Displays Introduction in the technique of active and passive displays, Dr. Alfred Hüthig-Verlag, Heidelberg, 1986, p. 216-220.

In the German application OS-33 22 729 a remote control device is described that comprises a transmitter in addition to a receiver. By a signal of the TV set the remote control device is switched onto standby status. Operation readiness is shown.

SUMMARY OF THE INVENTION

It is an object of the invention to propose a remote control device for a TV set which makes it easier for the user to choose his program by showing him pictures of the individual offered programs to be selected on the remote control device itself.

According to the invention the above problem is solved in that the remote control device has a receiver circuit receiving the picture signals of the TV programs selectable by the program selection keys and a storage unit storing these picture signals. Each program selection key on the remote control set is assigned to a picture display and a control circuit distributes the picture signals from the storage unit cyclically to the picture displays.

On this remote control device the corresponding current pictures of the programs to be selected can be seen by the user. The current program on the screen is uninterrupted. The user can watch the current program on the screen of the TV set until he desires another program on the picture display which he may be interested in viewing later. Therefore, in view of the frequent time shift of programs the user does not have to switch to the other program and back for a trial when the program he is interested in has not yet started.

Furthermore, the user receives a graphic survey of all current programs of the other channels. This saves him the trouble to check the TV magazine several times.

In a preferred embodiment of the invention the picture signals appear as cyclically appearing still pictures on the picture display. Preferably the still pictures of all programs to be selected appear on the picture display at the same time.

In one embodiment of the invention the receiver circuit is an infrared receiver receiving the picture signals from an infrared transmitter of the TV set. The picture signals of all TV programs to be selected are generated in the TV set and are radiated by an infrared transmitter provided on the TV set to the infrared receiver of the remote control device. The transfer takes place in a digitalized form with the signals of each picture being reduced compared to the original TV picture so that the band width of the IR channel is sufficient.

In another embodiment of the invention the receiver circuit has a tuner and derives the picture signals of the TV programs to be selected from TV antenna signals. In this case the generating of picture signals is independent from the TV set. This embodiment is therefore suitable for assignment to a TV set that does not generate the picture signals.

In a preferred embodiment of the invention each program selection key and the picture display assigned thereto coincide locally with each other. Then the user does not have to inform himself on the remote control device which of the picture displays is assigned to which of the program selection keys. By pushing the display which shows a picture of the desired program, the TV set is switched to this program.

Each picture display can be formed by its own LC-display. Then this is integrated with the program selection key. It is also possible to provide a single LC-display for all picture displays. In this case the program selection keys are all formed by a transparent foil keyboard or a sensor keyboard. Such a keyboard, for example, is described in the meeting documents ED 87 International Exhibition and Meeting, Wiesbaden 14.-16.10.1987, Editor: Network GmbH, Hagenburg 1987.

BRIEF DESCRIPTION OF THE DRAWINGS

Examples for embodiments can be seen from the following description. The figures in the drawings show.

DETAILED DESCRIPTION OF THE INVENTION

Figure 1:
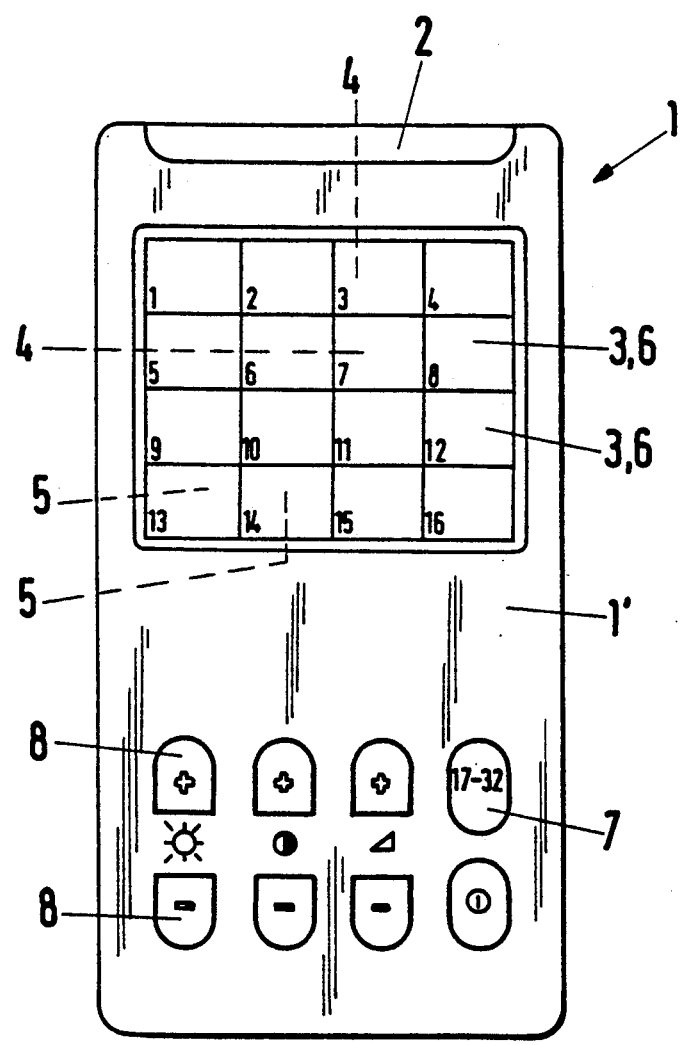
FIG. 1: a plan view of a first embodiment of a remote control device.

A remote control device 1 has a housing 1' comprising an infrared-transparent window 2. Program selection keys 3 are arranged on the housing 1' in lines 4 and columns 5. Each of the program selection keys 3 is integrated with a picture display 6. In the example, each of the sixteen program selection keys 3 and picture displays 5 are arranged in four lines 4 and four columns 5. Of course, also more or fewer program selection keys and picture displays can be provided. By way of a double-function key 7 a switching over can be done in a way that thirty-two programs can be selected and shown by means of the sixteen program selection keys 3 and the sixteen picture displays 6. By way of the program selection keys 3 the TV program of a TV set is switched on as usual. Further, keys 8 serve the purpose of controlling further functions of the TV set. In the embodiment according to FIG. 1 all picture displays 6 are formed by a single LC-display. This can be divided into the individual picture displays by electronic control devices. A foil keyboard is arranged on the LC-display comprising the program selection keys 3. Instead of the foil keyboard a sensor keyboard can be provided as well. The keyboard is transparent so that the picture displays 6 can be seen clearly. The keyboard can be glued onto a pane forming the front polarisator of the LC-display.

Figure 2:
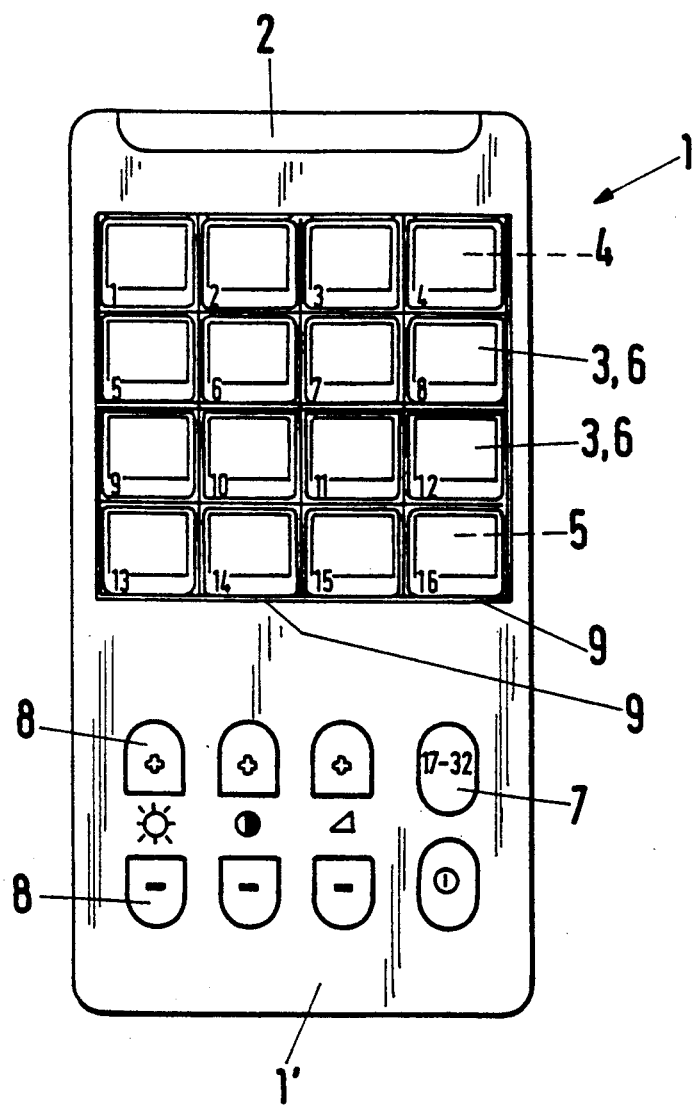
FIG. 2: a plan view of a second embodiment of a remote control device.

In the embodiment according to FIG. 2 the program selection keys 3 have key caps 9. In each of the key caps 9 an own LC-display forming a picture display 6 is installed. The program selection keys 3 in this embodiment have a significantly perceptible stroke.

Figure 3:
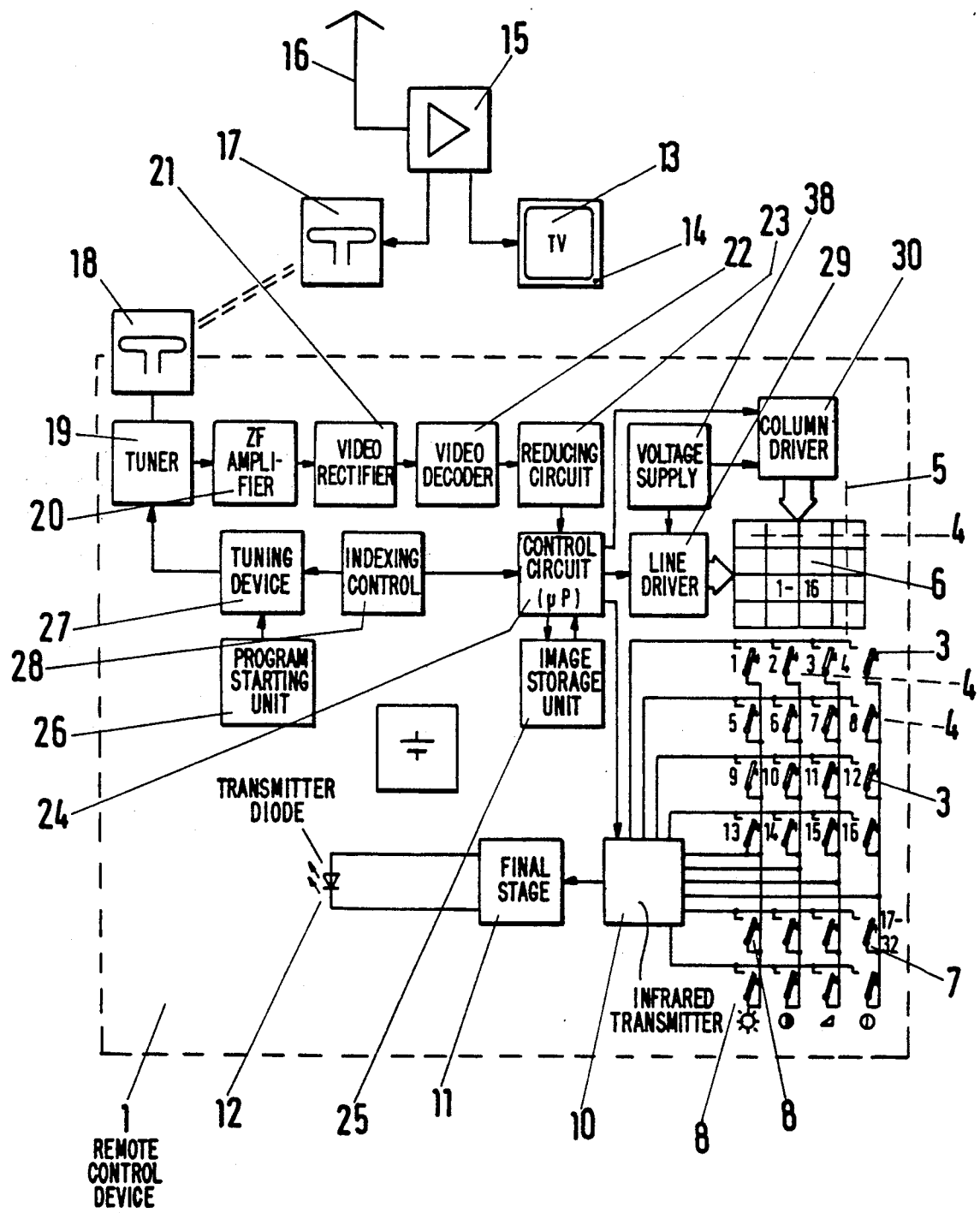
FIG. 3: a block diagram of a remote control device with an assigned TV set in a first embodiment.

According to the block diagram of FIG. 3 the remote control device 1 has an infrared transmitter IC 10, a transmitter final stage 11 and an infrared transmitter diode 12. The program selection keys 3 and the further keys 7, 8 are connected to the transmitter 10.

A TV set 13 is provided with an infrared receiver 14 receiving the signals of the infrared transmitter diode 12 and controlling the TV set 13 accordingly. The TV set 13 is connected to a house aerial 16 via an aerial amplifier 15. A room transmitter aerial 17 that radiates the signal of the TV house aerial in the room, is connected to aerial socket. The remote control 1 has an aerial 18 which receives the signal of the TV house aerial of the room transmitter aerial 17. The room transmitter aerial 17 can be neglected when it is to be expected that a sufficient TV signal is provided for the aerial 18.

A tuner 19, a ZF-amplifier 20, a video rectifier 21, a video decoder 22 and a circuit 23 for reducing the full video signal are series connected with the aerial 18. The picture signals received from the output of the circuit 23 are memorized into an image storage unit 25 via a control circuit 24 that, e.g., is formed by a microprocessor.

The remote control set 1 has a program storage unit 26 in which the programs selectable by the program selection keys 3 are stored. The program storage operates on the tuning device 27 connected to the tuner 19. The tuning device 27 is controlled by an indexing control 28 (scan control) so that the tuner 19 receives the programs or frequencies stored in the program storage 26 cyclically one after the other. The indexing control 28 is also connected to the control circuit 24 so that the picture of the program received is deposited in the place of the image storage unit 25 provided therefor. Controlled by the indexing control 28 a new image of the concerned program is deposited in the image storage unit 25 about every 2 to 5 seconds.

The control circuit 24 has a line driver 29 and a column driver 30 with which the picture displays 6 can be controlled. From the control circuit 24 the picture belonging to the program concerned, broadcast in this program shortly before, is put from the image storage unit 25 into the respective picture display 6. In the example at the same time pictures from programs that can be selected via the program selection keys 3 on the TV set appear on the sixteen picture displays 6 for the user.

Figure 4:
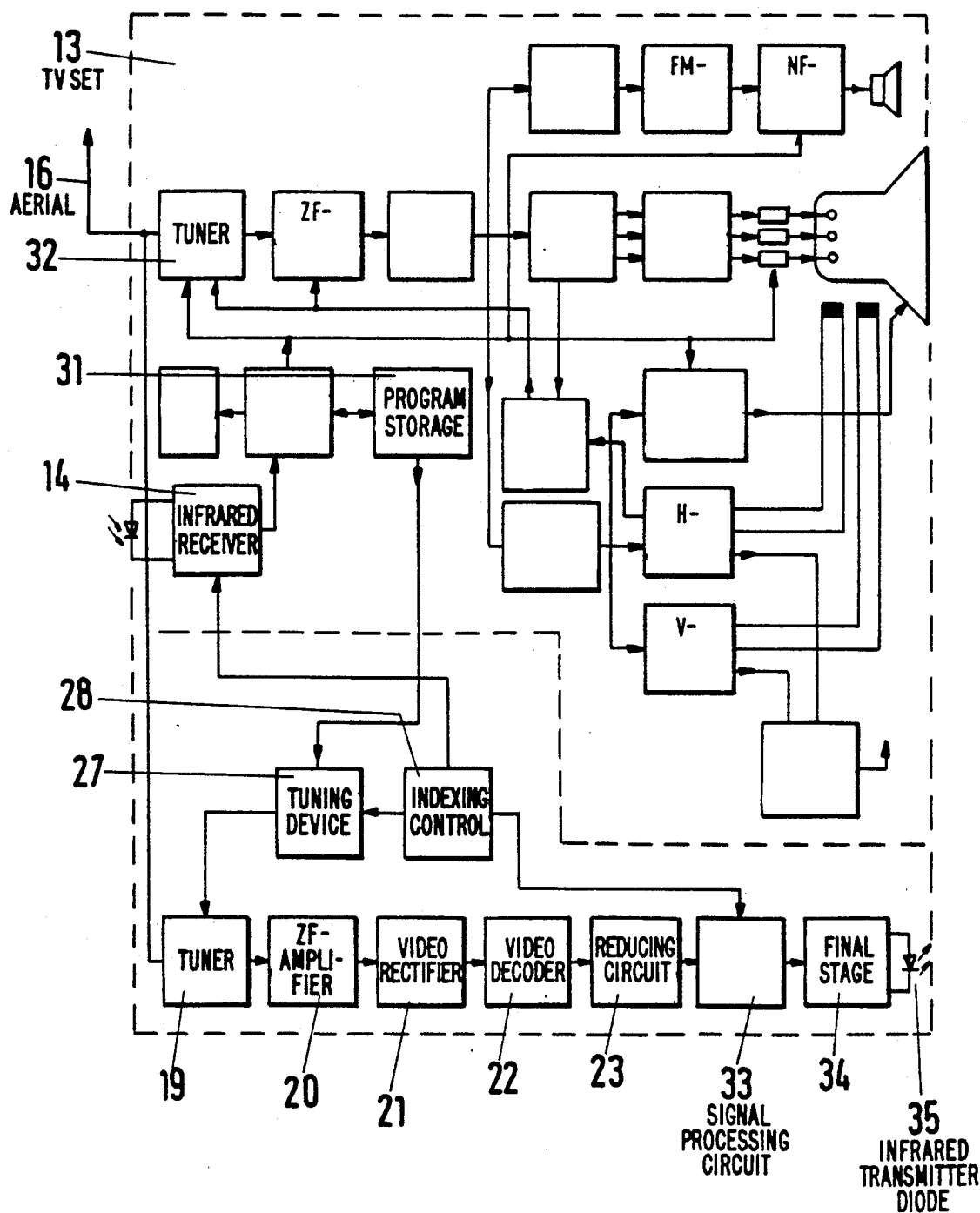
FIG. 4: a block diagram of a TV set for a remote control device according to FIG. 5.
Figure 5:
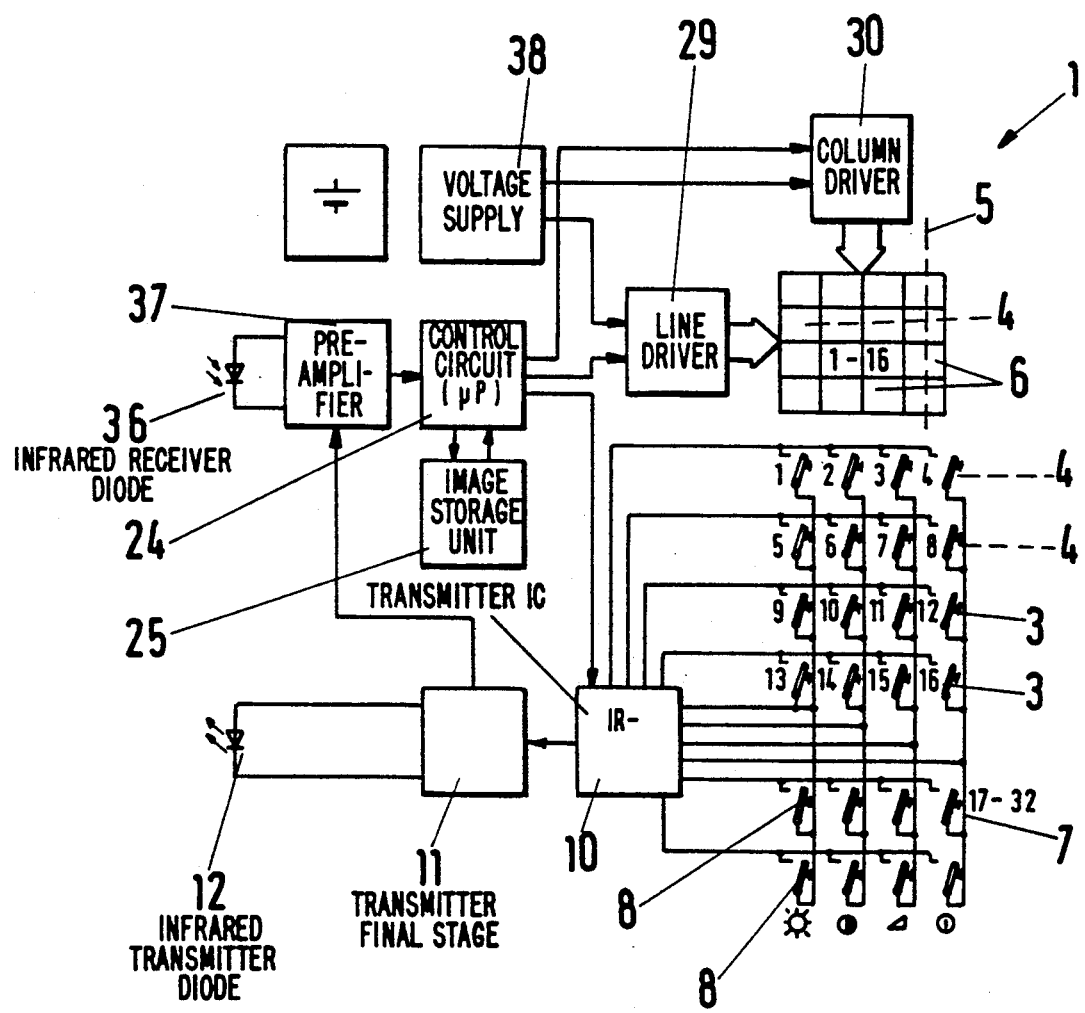
FIG. 5: a remote control device in a simplified embodiment compared with FIG. 3.

In the embodiment according to FIGS. 4 and 5 the structural components 19 to 23 and 27, 28 which are components of the remote control device 1 according to the embodiment of FIG. 3 are components of the TV set 13 (cf. FIG. 4). The TV set 13 has these components in addition to its usual components shown in FIG. 4 which, however, do not have to be described in more detail. A program storage 31 comprised in the TV set 13 is connected with the tuning device 27. Besides its tuner 32 provided for receiving the selected program the TV set 1 has the tuner 19 as an additional tuner. Both tuners 19 and 32 are connected to the same house aerial 16. A signal processing circuit 33 and a transmitter final stage 34 comprising an infrared transmitter diode 35 are series connected to the circuit 23. The signal processing circuit 33 is controlled by the indexing control 28. The indexing control 28 is also connected with the infrared receiver 14. It guarantees that an infrared signal cannot be transmitted and received simultaneously.

The picture signals of the programs of the channels that can be selected and which are transmitted by the transmitter diode 35. of the TV set 13 are received by an infrared receiver diode 36 of the remote control device 1 (cf. FIG. 5) and are amplified in a pre-amplifier 37. It is connected to the control circuit 24. As is described above, the picture signals are memorized in an image storage unit 25 and are transmitted to the picture displays 6 via the line driver 29 and the column driver 30. The transmitter final stage 11 is connected with the pre-amplifier 37 to avoid any simultaneous transmitting and receiving.

In the embodiments according to FIGS. 3 and 5 a voltage supply 38 is provided for one or several LC-displays, the one or several of them forming the picture displays 6.

What is claimed:

1. A remote control device for a TV set having an infrared transmitter, comprising:

infrared receiver means for receiving picture signals transmitted from the infrared transmitter;

storage means for storing the picture signals;

a plurality of program selection keys;

a plurality of picture displays, wherein one of said plurality of picture displays is assigned to each of the program selection keys and is disposed locally thereto; and means for cyclically distributing the picture signals from the storage means to the plurality of picture displays;

wherein the picture signals appear as cyclically updated still pictures on the plurality of picture displays, and wherein the still pictures appear on the plurality of picture displays simultaneously.

2. The remote control device as claimed in claim 1, wherein each picture display is an LC-display.

3. The remote control device as claimed in claim 1, wherein a single LC-display forms all of said plurality of picture displays.

4. A remote control device for a TV set, comprising:
   receiver means for receiving TV picture signals from a TV antenna signal and comprising a tuner;
   storage means for storing the picture signals;
   a plurality of program selection keys;
   a plurality of picture displays, wherein one of said plurality of picture displays is assigned to each of the program selection keys and is disposed locally thereto; and
   means for cyclically distributing the picture signals from the storage means to the plurality of picture displays;
   wherein the picture signals appear as cyclically updated still pictures on the plurality of picture displays, and wherein the still pictures appear on the plurality of picture displays simultaneously.

5. The remote control device as claimed in claim 4, wherein each picture display is an LC-display.

6. The remote control device as claimed in claim 3, wherein a single LC-display forms all of said plurality of picture displays.

* * * * *